United States Patent [19]

Sakata et al.

[11] Patent Number: 5,394,287
[45] Date of Patent: Feb. 28, 1995

[54] OVERCURRENT PROTECTIVE DEVICE FOR POWER DEVICE

[75] Inventors: Hiroshi Sakata; Masanori Fukunaga, both of Fukuoka, Japan

[73] Assignee: Mitsubishi Denki Kabushiki Kaisha, Tokyo, Japan

[21] Appl. No.: 10,756

[22] Filed: Jan. 29, 1993

[30] Foreign Application Priority Data

Apr. 13, 1992 [JP] Japan .................................. 4-092617

[51] Int. Cl.6 ......................... H02H 3/027; H02H 5/04
[52] U.S. Cl. ....................................... 361/18; 361/103; 361/57; 361/98
[58] Field of Search .................... 361/103, 106, 93, 94, 361/97, 98, 18, 24, 25, 37, 54, 56, 57, 46, 100; 323/284, 285, 312

[56] References Cited

U.S. PATENT DOCUMENTS

| | | | |
|---|---|---|---|
| 4,847,723 | 7/1989 | Kimmel | 361/94 |
| 4,937,697 | 6/1990 | Edwards et al. | 361/18 |

FOREIGN PATENT DOCUMENTS

| | | |
|---|---|---|
| 0252541 | 1/1988 | European Pat. Off. . |
| 0323813 | 7/1989 | European Pat. Off. . |
| 3519800 | 12/1985 | Germany . |
| 3823922 | 1/1989 | Germany . |
| 2-224521 | 9/1990 | Japan . |
| 2-37538 | 3/1992 | Japan . |

*Primary Examiner*—Jeffrey A. Gaffin
*Assistant Examiner*—Ronald W. Leja
*Attorney, Agent, or Firm*—Oblon, Spivak, McClelland, Maier & Neustadt

[57] ABSTRACT

A TSD (8) is provided in the vicinity of an IGBT (1), and reference voltages (VR1 to VR5) are provided to the negative inputs of comparators (51 to 55) as a function of a temperature detection signal (S8). A sense terminal (3) of the IGBT is connected to the positive inputs of the comparators (51 to 55) in common. An output signal (S51) of the comparator (51) and output signals (S72 to S75) of signal judging circuits (72 to 75) having received the output signals (S52 to S55) are applied to the input of an NOR gate (6) for on/off control of the IGBT. The signal judging circuits (72 to 75) normally output an L-level judgment signal (S7) and output an H-level judgment signal (S7) when the input signal is at the H level for periods of time that are not shorter than allowable durations ($\Delta t2$ to $\Delta t5$), respectively. This provides an overcurrent protective device for a power device which performs overcurrent protective operation adapted for a practical safe operating area of the power device.

7 Claims, 5 Drawing Sheets

OVERCURRENT PROTECTIVE DEVICE FOR POWER DEVICE

BACKGROUND OF THE INVENTION

1. Field of the Invention

The present invention relates to overcurrent protective devices for power devices.

2. Description of the Background Art

FIG. 4 is a circuit diagram of a conventional drive and overcurrent protective device for power devices. A drive signal S2 at H/L level is given from a drive circuit 2 such as a driver to the gate of an N-channel IGBT (insulated gate bipolar transistor) 1 to control the on/off operation of the IGBT 1.

The IGBT 1 is provided with a sense terminal 3 separately. The sense terminal 3 is grounded through a sense resistor 4. Since the sense terminal 3 is adapted to carry a current proportional to a collector current IC of the IGBT 1, the current proportional to the collector current IC flows in the sense resistor 4. As a result, the level of a sense voltage VS provided from the sense terminal 3 is proportional to the collector current IC.

The sense terminal 3 of the IGBT 1 is connected to the positive inputs of comparators 51 and 52 in common. A reference voltage VR1 is applied to the negative input of the comparator 51, and a reference voltage VR2 (<VR1) is applied to the negative input of the comparator 52.

An output signal S51 of the comparator 51 is applied to the input of an NOR gate 6. An output signal S52 of the comparator 52 is applied to a signal judging circuit 7. A judgment signal S7 of the signal judging circuit 7 is applied to the input of the NOR gate 6.

The signal judging circuit 7 normally outputs the L-level judgment signal S7 and outputs the H-level judgment signal S7 when a period that the output signal S52 of the comparator 52 to be inputted thereto is at the H level is not shorter than an allowable duration Δt.

A control signal SC is also applied to the input of the NOR gate 6. An output signal S6 of the NOR gate 6 is applied to the input of the drive circuit 2.

In such arrangement, as the control signal SC that is set at the L level is inputted to the NOR gate 6, the output signal S6 of the NOR gate 6 turns to the H level since the two other input signals S51 and S7 of the NOR gate 6 are normally at the L level. As a result, the drive circuit 2 gives the H-level drive signal S2 to the gate of the IGBT 1, so that the IGBT 1 turn on.

The sense voltage VS is equal to or lower than the reference voltage VR2 with respect to the collector current IC of the IGBT 1 in normal operation. The output signals S51 and S52 of the comparators 51 and 52 are held at the L level, so that the H level of the output signal S6 of the NOR gate 6 is unchanged. The IGBT 1 is held "on".

As the collector current IC of the IGBT 1 grows high due to increase in load and the like, the sense voltage VS accordingly grows high. When the sense voltage VS exceeds the reference voltage VR2, the output signal S52 of the comparator 52 turns to the H level.

However, the judgment signal S7 of the signal judging circuit 7 is held at the L level when the period of VS>VR2 is shorter than the allowable duration Δt, so that the IGBT 1 is held "on". When the period of VS>VR2 is equal to or longer than the allowable duration Δt, the judgment signal S7 of the signal judging circuit 7 turns to the H level. Then the output signal S6 of the NOR gate 6 turns to the L level and the L-level drive signal S2 is given from the drive circuit 2 to the gate of the IGBT 1. Accordingly, the IGBT 1 turns off and the collector current flowing in the IGBT 1 is interrupted to permit overcurrent protection to function.

As the collector current IC further grows high until the sense voltage VS exceeds the reference voltage VR1, the output signal S51 of the comparator 51 turns to the H level, so that the output signal S6 of the NOR gate 6 instantaneously turns to the L level independently of the H/L level of the judgment signal S7 of the signal judging circuit 7. As a result, the L-level drive signal S2 is given from the drive circuit 2 to the gate of the IGBT 1. Accordingly, the IGBT 1 turns off and the collector current flowing in the IGBT 1 is interrupted to permit the overcurrent protection to function.

As above described, the conventional overcurrent protective device for the IGBT, on detecting an overcurrent state in the IGBT by detecting the collector current of the IGBT, causes the IGBT to turn off whereby the overcurrent protection functions.

FIG. 5 is a graph showing an operating area of the IGBT. In FIG. 5, IC1 represents the collector current where the sense voltage VS is equal to the reference voltage VR1, and IC2 is the collector current where the sense voltage VS is equal to the reference voltage VR2. A curve L1 indicates the upper limit of the safe operation of the IGBT. That is, the safe operating area of the IGBT is an area in which the collector current IC varying with time is below the maximum safe operation curve L1. The IGBT is enabled to operate safely within the safe operating area.

Unfortunately, the drive and overcurrent protective device for the IGBT shown in FIG. 4 determines only shaded regions B1 and B2 of FIG. 5 as the safe operating area. There has been a problem in that the collector current IC varying with time, if practically within a region A1 included in the safe operating area, is taken as being in an abnormal operating area to cause the protective function to operate.

Furthermore, fixed are the reference voltages VR1 and VR2 serving as a reference for comparison of the comparators 51 and 52 and the allowable duration Δt by the signal judging circuit 7. Another problem is that it is impossible to judge the safe operating area adapted for the practical IGBT safe operating area varied with temperature changes of the IGBT itself.

SUMMARY OF THE INVENTION

The present invention is intended for an overcurrent protective device for a power device. According to the present invention, the overcurrent protective device comprises: current detecting means for detecting the amount of current flowing in the power device; and overcurrent protective means for establishing an allowable duration as a function of the amount of current to interrupt current supply to the power device when the amount of current is detected continuously for a period of time that is not shorter than the allowable duration.

Preferably, the current detecting means detects the amount of current flowing in the power device to output a current detection signal based on the amount of current, and the overcurrent protective means includes comparison signal providing means for providing first to n-th (n≧3) comparison signals; first to n-th comparing means including respective first comparative input portions receiving the first to n-th comparison signals and respective second comparative input portions receiving the current detection signal in common for comparing the first to n-th comparison signals with the current detection signal to output H-level first to n-th comparison result signals when the current detection signal is higher in level than the first to n-th comparison signals and to output L-level first to n-th comparison result signals when the first to n-th comparison signals are higher in level than the current detection signal, respectively; and current supply interruption control means receiving the first to n-th comparison result signals and having first to n-th allowable durations corresponding to the first to n-th comparison result signals for interrupting current supply to the power device when an i-th ($1 \leq i \leq n$) comparison result signal that is at least one of the first to n-th comparison result signals is at the H level for a period of time that is not shorter than an i-th allowable duration.

In another aspect of the present invention, the overcurrent protective device comprises: current detecting means for detecting the amount of current flowing in the power device; temperature detecting means for detecting a temperature of the power device; and overcurrent protective means for establishing an allowable duration as a function of the amount of current and the temperature of the power device to interrupt current supply to the power device when the amount of current is detected continuously for a period of time that is not shorter than the allowable duration.

Preferably, the current detecting means detects the amount of current flowing in the power device to output a current detection signal based on the amount of current, and the temperature detecting means detects the temperature of the power device to output a temperature detection signal based on the temperature, and the overcurrent protective means includes comparison signal output means receiving the temperature detection signal in common for outputting first to n-th comparison signals as a function of the temperature detection signal; first to n-th comparing means including respective first comparative input portions receiving the first to n-th comparison signals and respective second comparative input portions receiving the current detection signal for comparing the first to n-th comparison signals with the current detection signal to output H-level first to n-th comparison result signals when the current detection signal is higher in level than the first to n-th comparison signals and to output L-level first to n-th comparison result signals when the first to n-th comparison signals are higher in level than the current detection signal, respectively; and current supply interruption control means receiving the first to n-th comparison result signals and having first to n-th allowable durations corresponding to the first to n-th comparison result signals for interrupting current supply to the power device when an i-th ($1 \leq i \leq n$) comparison result signal that is at least one of the first to n-th comparison result signals is at the H level for a period of time that is not shorter than an i-th allowable duration.

Preferably, the current detecting means detects the amount of current flowing in the power device to output a current detection signal based on the amount of current, and the temperature detecting means detects the temperature of the power device to output a temperature detection signal based on the temperature, and the overcurrent protective means includes comparison signal output means for outputting first to n-th comparison signals; first to n-th comparing means including respective first comparative input portions receiving the first to n-th comparison signals and respective second comparative input portions receiving the current detection signal for comparing the first to n-th comparison signals with the current detection signal to output H-level first to n-th comparison result signals when the current detection signal is higher in level than the first to n-th comparison signals and to output L-level first to n-th comparison result signals when the first to n-th comparison signals are higher in level than the current detection signal; and current supply interruption control means receiving the first to n-th comparison result signals and the temperature detection signal for establishing first to n-th allowable durations determined as a function of the temperature detection signal in corresponding relation to the first to n-th comparison result signals to interrupt current supply to the power device when an i-th ($1 \leq i \leq n$) comparison result signal that is at least one of the first to n-th comparison result signals is at the H level for a period of time that is not shorter than an i-th allowable duration.

The overcurrent protective device of the first aspect according to the present invention establishes the allowable duration as a function of the amount of current flowing in the power device to interrupt the current supply to the power device when the amount of current is detected continuously for the period of time that is not shorter than the allowable duration. As a result, the overcurrent protective operation is performed which is adapted for a practical safe operating area of the power device based on relation between the amount of current and its continuous supply time.

The overcurrent protective device of the second aspect according to the present invention establishes the allowable duration as a function of the amount of current and temperature of the power device to interrupt the current supply to the power device when the amount of current is detected continuously for the period of time that is not shorter than the allowable duration. As a result, the overcurrent protective operation is performed which is adapted for the practical safe operating area of the power device based on the detected temperature of the power device as well as the relation between the amount of current and its continuous supply time.

The relation between the amount of current and the continuous current supply time is grasped by the use of the comparison results between not less than two first to n-th comparison signals and the current detection signal of the power device and the comparison results between the first to n-th allowable durations and the current supply duration where the detection signal is higher in level than the first to n-th comparison signals.

Furthermore, since the first to n-th comparison signals and the first to n-th allowable durations are adapted to vary as a function of the temperature of the power device, the temperature changes of the power device are taken into consideration to grasp the relation between the amount of current of the power device and the continuous current supply time.

An object of the present invention is to provide an overcurrent protective device which performs on a power device such as an IGBT an overcurrent protective operation adapted for a practical safe operating area of the power device.

DESCRIPTION OF THE PREFERRED EMBODIMENTS

Figure 1:
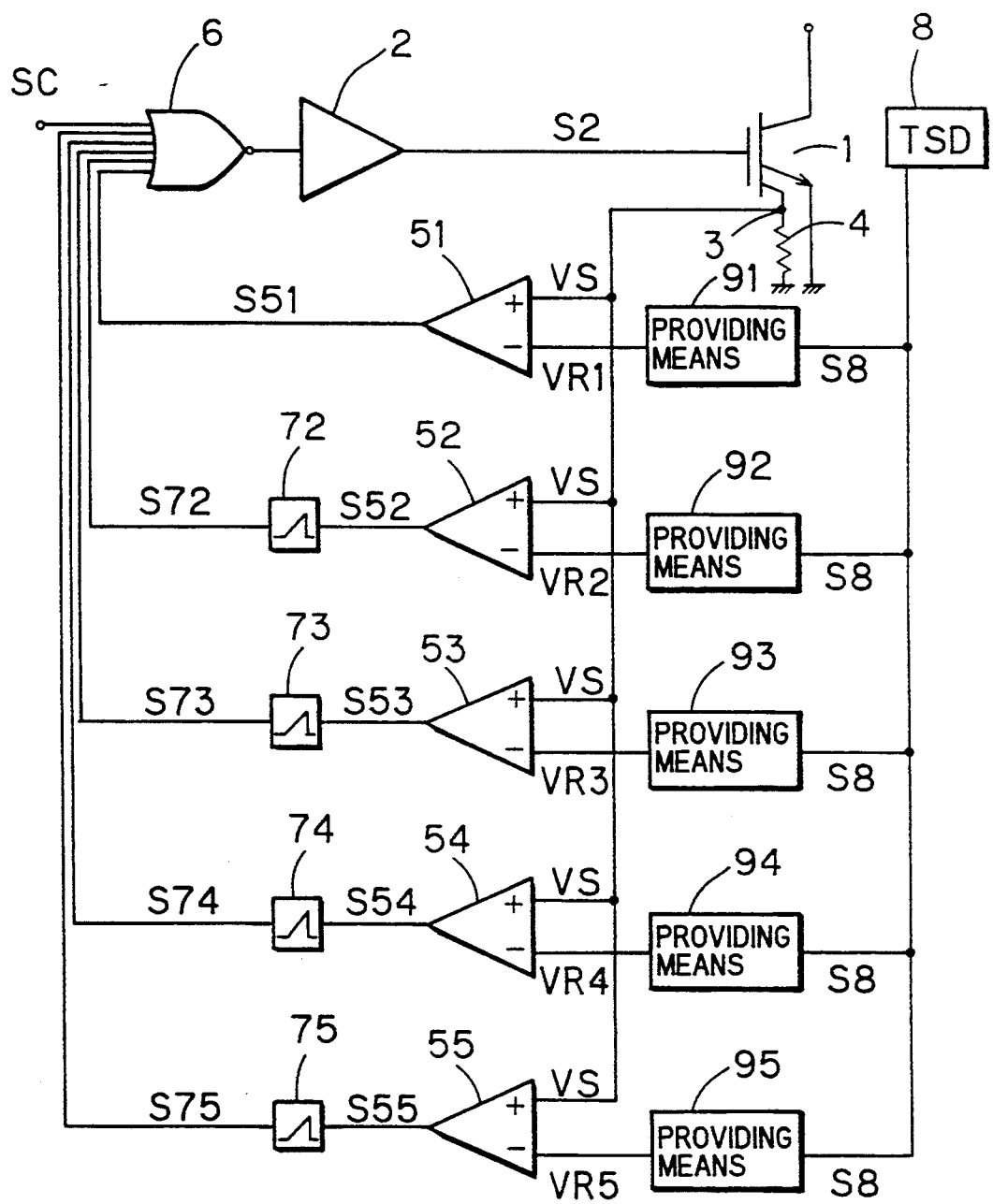
FIG. 1 is a circuit diagram of a drive and overcurrent protective device for an IGBT having plural providing means, comparators and signal judging circuits.

FIG. 1 is a circuit diagram of a drive and overcurrent protective device for an IGBT according to a first preferred embodiment of the present invention. A drive signal S2 at H/L level is given from a drive circuit 2 such as a driver to the gate of an N-channel IGBT 1 to control the on/off operation of the IGBT 1. A TSD (thermal sensing device) 8 is provided in the vicinity of the IGBT 1. The TSD 8 detects the temperature of the IGBT 1 to output a temperature detection signal S8 to reference voltage providing means 91 to 95.

The reference voltage providing means 91 to 95 establish reference voltages VR1 to VR5 such that they decrease as the temperature of the IGBT 1 rises as a function of the temperature detection signal S8 to output them. The reference voltages VR1 to VR5 are sure to satisfy the level conditions of $VR1 > VR2 > VR3 > VR4 > VR5$.

The IGBT 1 is provided with a sense terminal 3 separately. The sense terminal 3 is grounded through a sense resistor 4. Since the sense terminal 3 is adapted to carry a current proportional to a collector current IC of the IGBT 1, the current proportional to the collector current IC flows in the sense resistor 4. As a result, a sense voltage VS provided from the sense terminal 3 has a level proportional to the collector current IC.

The sense terminal 3 of the IGBT 1 is connected to the positive inputs of comparators 51 to 55 in common. The reference voltages VR1 to VR5 outputted from the reference voltage providing means 91 to 95 are applied to the negative inputs of the comparators 51 to 55, respectively.

Am output signal S51 of *the comparator 51 is applied to the input of an NOR gate 6, and output signals S52 to S55 of the comparators 52 to 55 are respectively applied to signal judging circuits 72 to 75. Judgment signals S72 to S75 of the signal judging circuits 72 to 75 are applied to the input of the NOR gate 6.

The signal judging circuits 72 to 75 normally output the L-level judgment signals S72 to S75 and output the H-level judgment signals S72 to S75 when periods that the output signals S52 to S55 of the comparators 52 to 55 to be inputted thereto are at the H level are not shorter than allowable durations $\Delta t2$ to $\Delta t5$, respectively. The time widths of the allowable durations $\Delta t2$ to $\Delta t5$ are established in ascending order of length.

A control signal SC is applied to the input of the NOR gate 6. An output signal S6 of the NOR gate 6 is applied to the input of the drive circuit 2.

In such arrangement, as the control signal SC that is at the L level is inputted to the NOR gate 6, the output signal S6 of the NOR gate 6 turns to the H level since the five other input signals S51, S72 to S75 of the NOR gate 6 are normally at the L level. As a result, the drive circuit 2 gives the L-level drive signal S2 to the gate of the IGBT 1, so that the IGBT 1 turns off.

The sense voltage VS is equal to or lower than the reference voltage VR5 with respect to the collector current IC of the IGBT 1 in normal operation. The output signals S51 to S55 of the comparators 51 to 55 are held at the L level, so that the H level of the output signal S6 of the NOR gate 6 is unchanged. The IGBT 1 is held "on".

As the collector current IC of the IGBT 1 grows high due to increase in load and the like, the sense voltage VS accordingly grows high. When the sense voltage VS exceeds the reference voltage VR5, the output signal S55 of the comparator 55 turns to the H level.

However, the judgment signal S75 of the signal judging circuit 75 is held at the L level when the period of $VS > VR5$ is shorter than the allowable duration $\Delta t5$, so that the IGBT 1 is held "on". On the other hand, when the period of $VS > VR5$ is equal to or longer than the allowable duration $\Delta t5$, the judgment signal S75 of the signal judging circuit 75 turns to the H level. Accordingly, the output signal S6 of the NOR gate 6 turns to the L level, and the L-level drive signal S2 is given from the drive circuit 2 to the gate of the IGBT 1. Then the IGBT 1 turns off and the collector current IC flowing in the IGBT 1 is interrupted to permit overcurrent protection to function.

Similarly, when the period of $VS > VR4$, $VS > VR3$ or $VS > VR2$ is respectively equal to or longer than the allowable duration $\Delta t4$, $\Delta t3$ or $\Delta t2$, at least one of the judgment signals S72 to S74 of the signal judging circuits 72 to 74 turns to the H level. Accordingly, the output signal S6 of the NOR gate 6 turns to the L level, and the L-level drive signal S2 is given from the drive circuit 2 to the gate of the IGBT 1. Then the IGBT 1 turns off and the collector current IC flowing in the IGBT 1 is interrupted to permit the overcurrent protection to function.

As the collector current IC further grows high until the sense voltage VS exceeds the reference voltage VR1, the output signal S51 of the comparator 51 turns to the H level, so that the output signal S6 of the NOR gate 6 turns to the L level independently of the H/L level of the judgment signals S72 to S75 of the signal judging circuits 72 to 75. As a result, the L-level drive signal is given from the drive circuit 2 to the gate of the IGBT 1. Then the IGBT 1 turns off and the collector current flowing in the IGBT 1 is interrupted to permit the overcurrent protection to function.

Figure 2:
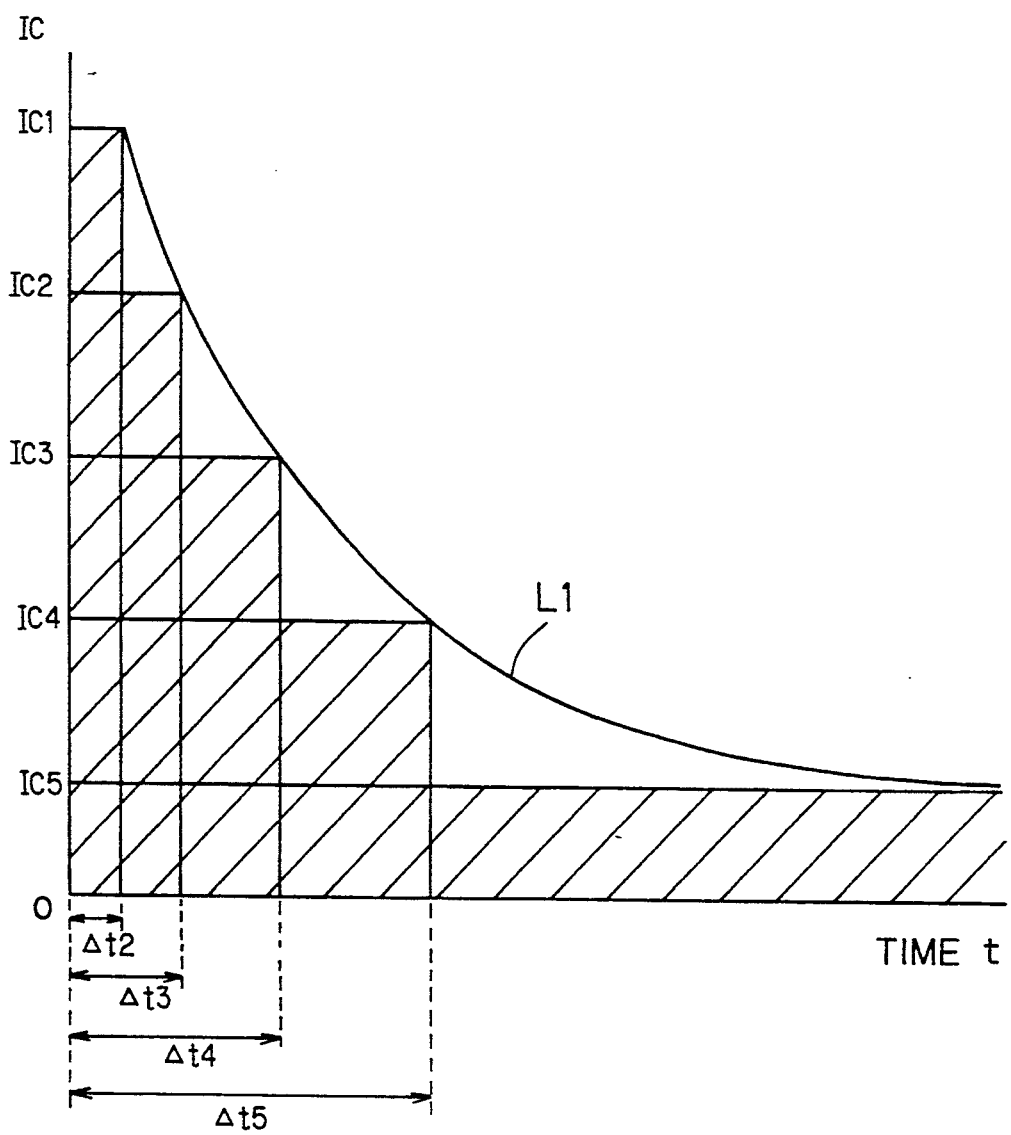
FIG. 2 is a graph showing an operating area of the IGBT.

FIG. 2 is a graph showing an operating area of the IGBT 1. In the graph, IC1, IC2, IC3, IC4, and IC5 represent the collector current where the sense voltage VS is equal to the reference voltages VR1, VR2, VR3, VR4, and VR5, respectively. A maximum safe operation curve L1 indicates the upper limit of a safe operating area of the IGBT 1. That is, the IGBT 1 is enabled to operate safely when the collector current IC varied with time is below the maximum safe operation curve L1.

Figure 5:
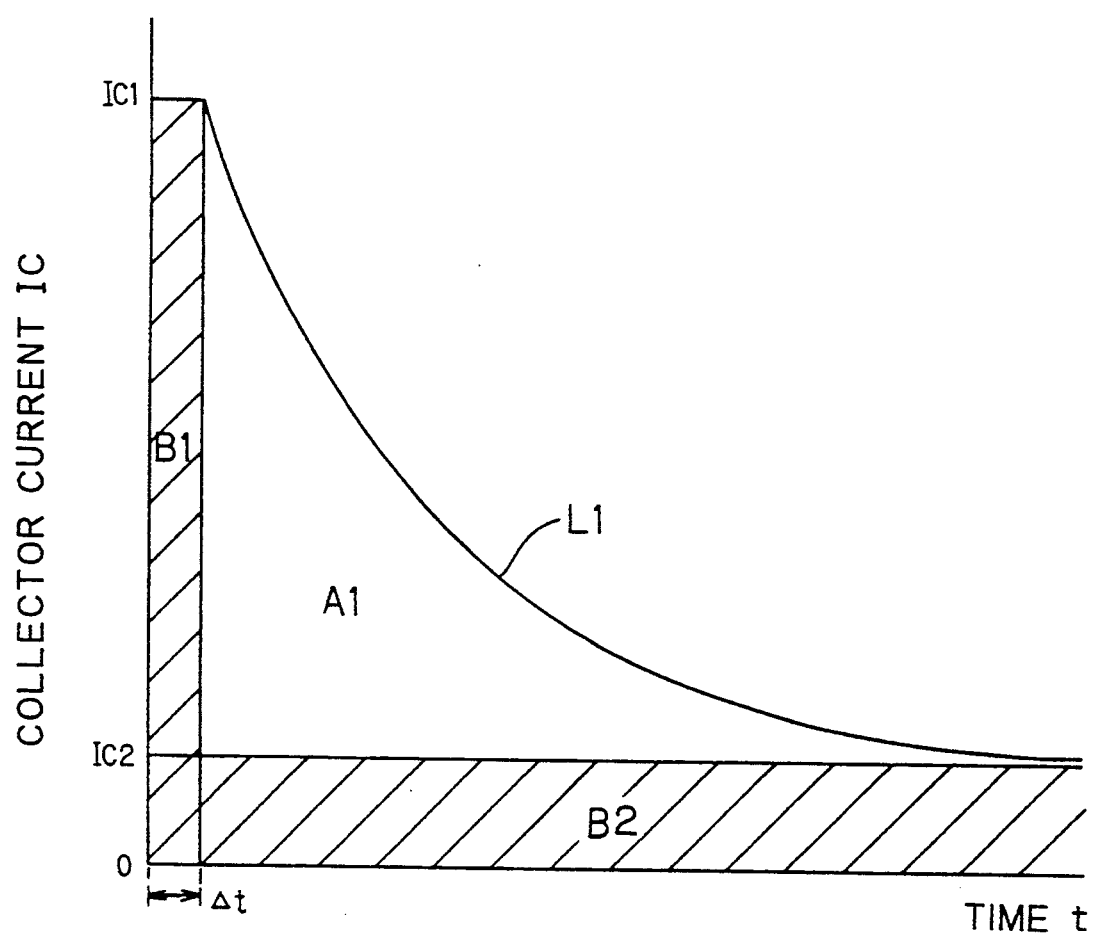
FIG. 5 is a graph showing the operating area of the IGBT.

As shown in FIG. 2, the drive and overcurrent protective device for the IGBT of the first preferred embodiment determines a shaded region as the safe operating area. Therefore, a region much adapted for the maximum safe operation curve L1 is determined as the safe operating area as compared with the determination of the conventional drive and overcurrent protective device of FIG. 5. As a result, the overcurrent protective device of this preferred embodiment has the overcurrent protective function adapted for the practical IGBT safe operating area.

The reference voltages VR1 to VR5 outputted respectively from the reference voltage providing means 91 to 95 vary as a function of the temperature detection signal S8 from the TSD 8 which is the signal of the detected temperature of the IGBT 1. Thus the overcurrent protective device of this preferred embodiment correctly determines the safe operating area adapted for the practical IGBT safe operating area varying with temperature changes of the IGBT itself. Unless the detected temperature of the IGBT 1 is taken into consideration, the reference voltages and allowable durations under the worst temperature conditions must be established. Such operation is not required in the first preferred embodiment.

Figure 3:
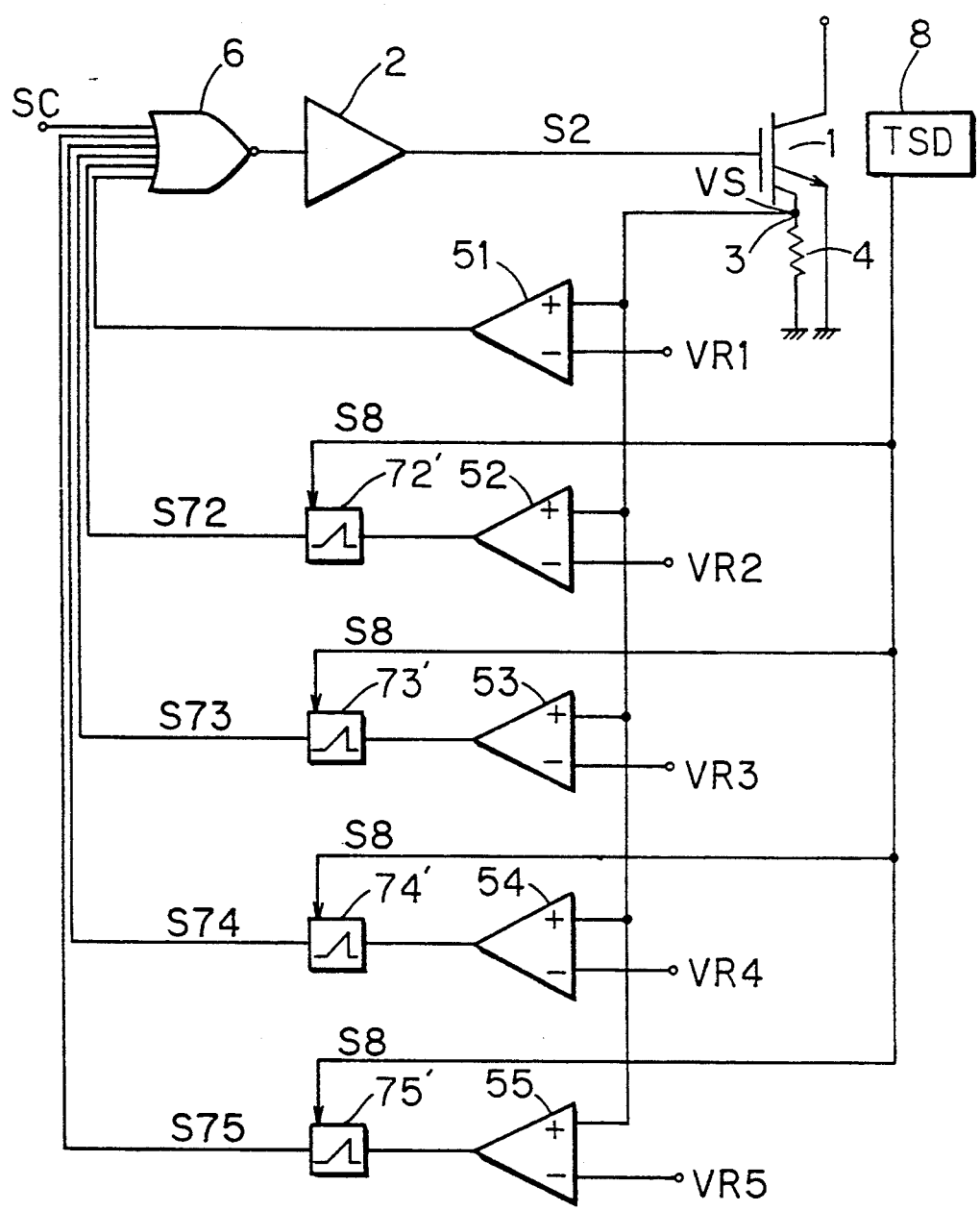
FIG. 3 is a circuit diagram of the drive and overcurrent protective device for the IGBT having a thermal sensing device, comparators and signal judging circuits.
Figure 4:
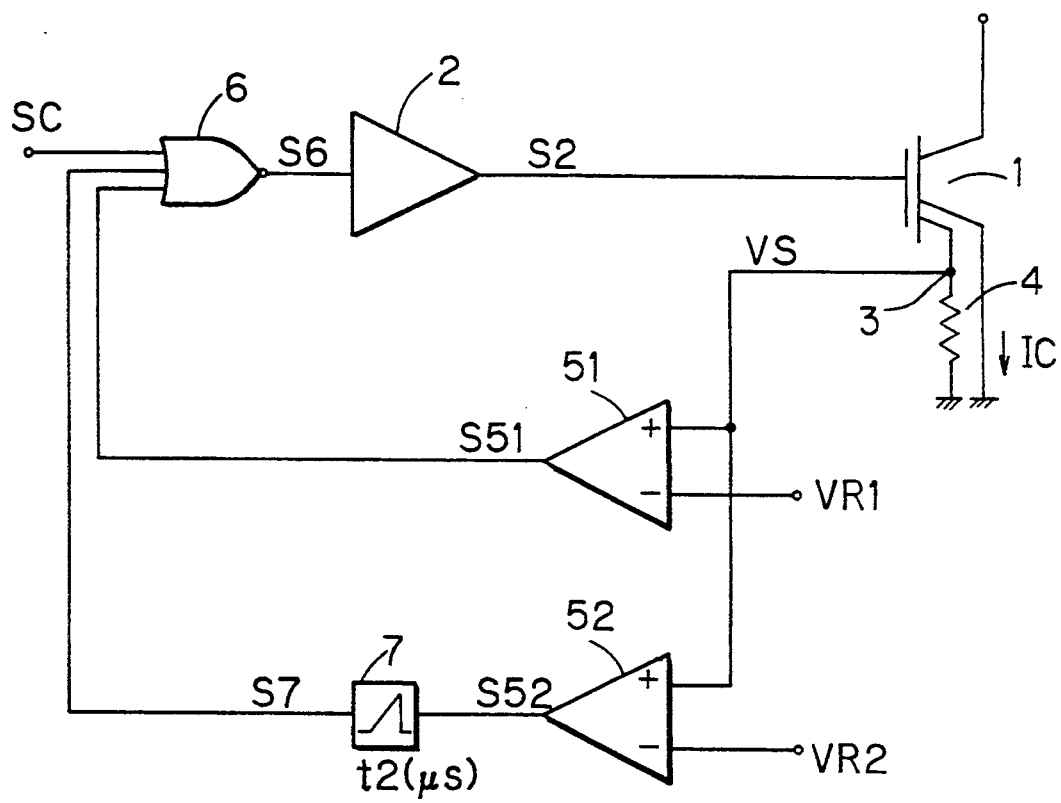
FIG. 4 is a circuit diagram of a conventional drive and overcurrent protective device for the IGBT.

FIG. 3 is a circuit diagram of a drive and overcurrent protective device for the IGBT according to a second preferred embodiment of the present invention. The drive signal S2 at H/L level is given from the drive circuit 2 to the gate of the IGBT 1 to control the on/off operation of the IGBT 1. The TSD 8 is provided in the vicinity of the IGBT 1. The TSD 8 detects the temperature of the IGBT 1 to output the temperature detection signal S8 to signal judging circuits 72' to 75'.

The IGBT 1 is provided with the sense terminal 3 separately. The sense terminal 3 is grounded through the sense resistor 4. Since the sense terminal 3 is adapted to carry the current proportional to the collector current IC of the IGBT 1, the current proportional to the collector current IC flows in the sense resistor 4. As a result, the sense voltage VS provided from the sense terminal 3 has the level proportional to the collector current IC.

The sense terminal 3 of the IGBT 1 is connected to the positive inputs of the comparators 51 to 55 in common. The fixed reference voltages VR1 to VR5 outputted from the reference voltage providing means not shown are applied to the negative inputs of the comparators 51 to 55, respectively. It should be noted that the reference voltages VR1 to VR5 are sure to satisfy the level conditions of VR1>VR2>VR3>VR4>VR5.

The output signal S51 of the comparator 51 is applied to the input of the NOR gate 6, and the output signals S52 to S55 of the comparators 52 to 55 are applied to the signal judging circuits 72' to 75', respectively. The judgment signals S72 to S75 of the signal judging circuits 72' to 75' are applied to the input of the NOR gate 6.

The signal judging circuits 72' to 75' normally output the L-level judgment signals S72 to S75 and output the H-level judgment signals S72 to S75 when the periods that the output signals S52 to S55 of the comparators 52 to 55 to be inputted thereto are at the H level are not shorter than the allowable durations Δt2 to Δt5, respectively.

The signal judging circuits 72' to 75' receive the temperature detection signal S8 in common to vary tile allowable durations Δt2 to Δt5 serving as a reference for judgment as a function of the temperature detection signal S8, respectively. Specifically, the allowable durations Δt2 to Δt5 are shortened as the temperature of the IGBT 1 rises. It should be noted that the time widths of the allowable durations Δt2 to Δt5 are established in ascending order of length.

The control signal SC is also applied to the input of the NOR gate 6. The output signal S6 of the NOR gate 6 is applied to the input of the drive circuit 2.

In such arrangement, as the control signal SC that is set at the L level is inputted to the NOR gate 6, the output signal S6 of the NOR gate 6 turns to the H level since the five other input signals S51, S72 to S75 of the NOR gate 6 are normally at the L level. As a result, the drive circuit 2 gives the H-level drive signal S2 to the gate of the IGBT 1, so that the IGBT 1 turns on.

The sense voltage VS is equal to or lower than the reference voltage VR5 with respect to the collector current IC of the IGBT 1 in normal operation. The output signals S51 to S55 of the comparators 51 to 55 are held at the L level, so that the H level of the output signal S6 of the NOR gate 6 is unchanged. The IGBT 1 is held "on".

As the collector current IC of the IGBT 1 grows high due to increase in load and the like, the sense voltage VS accordingly grows high. When the sense voltage VS exceeds the reference voltage VR5, the output signal S52 of the comparator 52 turns to the H level.

However, the judgment signal S75 of the signal judging circuit 75' is held at the L level when the period of VS>VR5 is shorter than the allowable duration Δt5, so that the IGBT 1 is held "on". On the other hand, when the period of VS>VR5 is equal to or longer than the allowable duration Δt5, the judgment signal S75 of the signal judging circuit 75' turns to the H level. The output signal S6 of the NOR gate 6 turns to the L level, and the L-level drive signal S2 is given from the drive circuit 2 to the gate of the IGBT 1. Then the IGBT 1 turns off and the collector current flowing in the IGBT 1 is interrupted to permit the overcurrent protection to function.

Similarly, when the period of VS>VR4, VS>VR3 or VS>VR2 is respectively equal to or longer than the allowable duration Δt4, Δt3 or Δt2, at least one of the judgment signals S72 to S74 of the signal judging circuits 72' to 74' turns to the H level. Accordingly, the output signal S6 of the NOR gate 6 turns to the L level and the L-level drive signal S2 is given from the drive circuit 2 to the gate of the IGBT 1. Then the IGBT 1 turns off and the collector current IC flowing therein is interrupted to permit the overcurrent protection to function.

As the collector current IC further grows high until the sense voltage VS exceeds the reference voltage VR1, the output signal S51 of the comparator 51 turns to the H level, so that the output signal S6 of the NOR gate 6 turns to the L level independently of the H/L level of the judgment signals S72 to S75 of the signal judging circuits 72' to 75'. As a result, the L-level drive signal S2 is given from the drive circuit 2 to the gate of the IGBT 1. Then the IGBT 1 turns off and the collector current flowing therein is interrupted to permit the overcurrent protection to function.

As above described, the drive and overcurrent protective device for the IGBT of the second preferred embodiment determines the safe operating area adapted for the practical IGBT safe operating area to perform the overcurrent protective operation as well as the first preferred embodiment.

Furthermore, since the allowable durations Δt2 to Δt5 serving as the judgment reference of the signal judging circuits 72' to 75' vary as a function of the temperature detection signal S8 from the TSD 8 which is the signal of the detected temperature of the IGBT, the second preferred embodiment correctly determines the safe operating area adapted for the practical IGBT safe operating area varying with temperature changes of the IGBT itself as well as the first preferred embodiment.

In the second preferred embodiment, there may be provided a signal judging circuit identical with the signal judging circuits 72' to 75' between the output of the comparator 51 and the input of the NOR gate 6 to vary the judging time thereof as a function of the temperature detection signal S8.

The respective preferred embodiments comprise the five comparators and four signal judging circuits. The present invention, however, is not limited thereto. More reference voltages and more allowable durations may be established by increasing the number of comparators and signal judging circuits. This enables the safe operating area to approximate to the practical IGBT safe operating area for judgment thereof to perform the overcurrent protective operation on the IGBT.

The IGBT is employed as an example of the power device in the first and second preferred embodiments. The present invention is not limited thereto but is applicable to other power devices which may detect the amount of current such as power MOSFETs.

The plurality of reference voltages and stepwise judging times are established for comparison with the sense voltage VS in the first and second preferred embodiments, thereby providing the judgment result of the safe operating area approximate to the practical IGBT safe operating area. Alternatively, there may be provided means for detecting the level of the sense voltage VS and signal judging means for establishing the judging time linearly in proportion to the level of the sense voltage VS to provide the judgment result of the safe operating area more approximate to the practical IGBT safe operating area.

While the invention has been shown and described in detail, the foregoing description is in all aspects illustrative and not restrictive. It is therefore understood that numerous modifications and variations can be devised without departing from the scope of the invention.

We claim:

1. An overcurrent protective device for a power device, comprising:
   current detecting means for detecting an amount of current flowing in said power device;
   temperature detecting means for detecting a temperature of said power device; and
   overcurrent protective means for establishing an allowable duration as a function of said amount of current and said temperature of said power device to interrupt current supply to said power device when said amount of current is detected continuously for a period of time that is not shorter than said allowable duration;
   wherein said current detecting means detects said amount of current flowing in said power device to output a current detection signal based on said amount of current;
   wherein said temperature detecting means detects said temperature of said power device to output a temperature detection signal based on said temperature;
   wherein said overcurrent protective means includes:
   comparison signal providing means receiving said temperature detection signal in common for providing first to n-th comparison signals as a function of said temperature detection signal,
   first to n-th comparing means including respective first comparative input portions receiving said first to n-th comparison signals and respective second comparative input portions receiving said current detection signal for comparing said first to n-th comparison signals with said current detection signal to output H-level first to n-th comparison result signals when said current detection signal is higher in level than said first to n-th comparison signals and to output L-level first to n-th comparison result signals when said first to n-th comparison signals are higher in level than said current detection signal, respectively, and
   current supply interruption control means receiving said first to n-th comparison result signals and having first to n-th allowable durations corresponding to said first to n-th comparison result signals for interrupting current supply to said power device when an i-th ($1 \leq i \leq n$) comparison result signal that is at least one of said first to n-th comparison result signals is at the H level for a period of time that is not shorter than an i-th allowable duration;
   wherein said current supply interruption control means includes:
   second to n-th duration judging means provided in corresponding relation to said second to n-th comparison result signals and 2having said second to n-th allowable durations, respectively, each of said second to n-th duration judging means outputting a judgment comparison signal, said judgment comparison signal being normally at the L level and turning to the H level when the corresponding comparison result signal at the H level is inputted for a period of time that is not shorter than the corresponding allowable duration, and
   current supply interruption drive means receiving said first comparison result signal and said second to n-th judgment comparison signals for interrupting current supply to said power device when at least one of said first comparison result signal and said second to n-th judgment comparison signals is at the H level;
   wherein the levels of said first to n-th comparison signals are established in descending order of voltage level and said first to n-th allowable durations are established in ascending order of length; and
   wherein said comparison signal providing means establishes said first to n-th comparison signals whose level is decreased as the level of said temperature detection signal increases.

2. The overcurrent protective device of claim 1, wherein said power device is an insulated gate bipolar transistor (IGBT).

3. The overcurrent protective device of claim 2, wherein said current supply interruption drive means includes a NOR gate receiving said second to n-th judgment comparison signals and the first comparison result signal; and
   a drive circuit receiving an output of said NOR gate for outputting a signal whose level causes said IGBT to turn off when the output of said NOR gate is at the L level.

4. An overcurrent protective device for a power device, comprising:
   current detecting means for detecting an amount of current flowing in said power device;

temperature detecting means for detecting a temperature of said power device; and overcurrent protective means for establishing an allowable duration as a function of said amount of current and said temperature of said power device to interrupt current supply to said power device when said amount of current is detected continuously for a period of time that is not shorter than said allowable duration;

wherein said current detecting means detects said amount of current flowing in said power device to output a current detection signal based on said amount of current;

wherein said temperature detecting means detects said temperature of said power device to output a temperature detection signal based on said temperature;

wherein said overcurrent protective means includes:

comparison signal output means for outputting first to nth comparison signals, first to n-th comparing means including respective first comparative input portions receiving said first to n-th comparison signals and respective second comparative input portions receiving said current detection signal for comparing said first to n-th comparison signals with said current detection signal to output H-level first to n-th comparison result signals when said current detection signal is higher in level than said first to n-th comparison signals and to output L-level first to n-th comparison result signals when said first to n-th comparison signals are higher in level than said current detection signal, and current supply interruption control means receiving said first to n-th comparison result signals and said temperature detection signal for establishing first to n-th allowable durations determined as a function of said temperature detection signal in corresponding relation to said first to nth comparison result signals to interrupt current supply to said power device when an i-th ($1 \leq i \leq n$) comparison result signal that is at least one of said first to n-th comparison result signals is at the H level for a period of time that is not shorter than an i-th allowable duration;

wherein said current supply interruption control means includes:

second to n-th duration judging means provided in corresponding relation to said second to n-th comparison result signals and receiving said temperature detection signal and having said second to n-th allowable durations determined as a function of said temperature detection signal, respectively, each of said second to n-th duration judging means outputting a judgment comparison signal, said judgment comparison signal being normally at the L level and turning to the H level when the corresponding comparison result signal at the H level is inputted for a period of time that is not shorter than the corresponding allowable duration, and current supply interruption drive means receiving said first comparison result signal and said second to n-th judgment comparison signals for interrupting current supply to said power device when at least one of said first comparison result signal and said second to n-th judgment comparison signals is at the H level;

wherein the levels of said first to n-th comparison signals are established in descending order of voltage level and said second to n-th allowable durations are established in ascending order of length; and wherein said duration judging means determines said second to n-th allowable durations that are shortened as the level of said temperature detection signal increases.

5. The overcurrent protective device of claim 4, wherein said first allowable duration is zero.

6. The overcurrent protective device of claim 4, wherein said power device is an insulated gate bipolar transistor (IGBT).

7. The overcurrent protective device of claim 6, wherein said current supply interruption drive means includes a NOR gate receiving said second to n-th judgment comparison signals and the first comparison result signal; and a drive circuit receiving an output of said NOR gate for outputting a signal whose level causes said IGBT to turn off when the output of said NOR gate is at the L level.

* * * * *